United States Patent [19]

Boudewijns

[11] Patent Number: 4,965,815
[45] Date of Patent: Oct. 23, 1990

[54] PHASE DETECTION CIRCUIT FOR STEPWISE MEASUREMENT OF A PHASE RELATION

[75] Inventor: Arnoldus J. J. Boudewijns, Eindhoven, Netherlands

[73] Assignee: U.S. Philips Corporation, New York, N.Y.

[21] Appl. No.: 369,568

[22] Filed: Jun. 21, 1989

[30] Foreign Application Priority Data

Jul. 21, 1988 [NL] Netherlands ............... 8801845

[51] Int. Cl.[5] ........................................... H04L 7/00
[52] U.S. Cl. .................................. 375/119; 331/96; 328/55; 328/72
[58] Field of Search ................. 375/120, 119, 118; 331/46, 47, 55, 56, 60; 328/72, 55; 307/526, 510, 409, 269; 370/108

[56] References Cited

U.S. PATENT DOCUMENTS

| | | | |
|---|---|---|---|
| 4,584,695 | 4/1986 | Wong et al. | 375/120 |
| 4,604,582 | 8/1986 | Strenkowski et al. | 328/55 |
| 4,713,621 | 12/1987 | Nakamura et al. | 328/72 |

FOREIGN PATENT DOCUMENTS 0137323  4/1985  European Pat. Off. .

OTHER PUBLICATIONS

IDTV Receiver, Kawai et al; IEEE Transactions on Consumer Electronics, vol. CE—33, No. 3, Aug. 1987.

*Primary Examiner*—Douglas W. Olms
*Assistant Examiner*—Marianne Huseman
*Attorney, Agent, or Firm*—Edward W. Goodman

[57] ABSTRACT

In a phase detection circuit for detecting the phase relation between a first ($f_1$) and a second ($f_2$) clock signal in which tappings (b, c, d, e, f, g, h, i) of a delay circuit (7) for the first clock signal are connected to memory elements (27, 29, 31, 33, 35, 37, 39, 41) clocked by the second clock signal and having their outputs (B, C, D, E, F, G, H, I) connected to a logic circuit (59) and in which a plurality of outputs of the delay circuit (7) is connected to a measuring circuit (89, 95) for measuring the delay time of the delay circuit, a control circuit (87, 85, 93, 91, 83, 77, 79, 81) controlled by the measuring circuit is arranged for controlling the delay time of the delay circuit at a value corresponding to the period of the first clock signal, while the logic circuit includes an AND-gate (61, 65, 69, 73) alternating with a NOR-gate (63, 67, 71, 75) for obtaining a very accurate and unambiguous phase detection, using few circuit elements.

4 Claims, 2 Drawing Sheets

PHASE DETECTION CIRCUIT FOR STEPWISE MEASUREMENT OF A PHASE RELATION

BACKGROUND OF THE INVENTION

1. Field of the Invention

The invention relates to a phase detection circuit for stepwise measurement of a phase relation between two clock signals, comprising a delay circuit controllable by a first one of the two clock signals, said circuit having a plurality of tappings each being coupled to an input of a different one of a plurality of memory elements, a clock signal input of each of the memory elements is controllable by the second one of the two clock signals and an output of each of the memory elements is coupled to a logic circuit for determining the phase relation to be measured, while a measuring circuit for determining the period of the first clock signal is coupled to a plurality of outputs of the delay circuit.

2. Description of Related Art

A phase detection circuit of the type described above is known from IEEE Transactions on Consumer Electronics, Aug. 1987, pages 188, 189 in which the measuring circuit comprises a plurality of further memory elements each being connected to an output of the delay circuit and whose clock signal inputs receive the first clock signal. To be able to measure the period of the first clock signal with sufficient accuracy, a large number of these further memories is required. The outputs of the further memory elements are also connected to the logic circuit with which the ratio of the time interval between an edge of the first clock signal and of the second clock signal with respect to the period of the first clock signal is determined. To be able to do this unambiguously and accurately, a logic circuit having a large number of circuit elements is required.

SUMMARY OF THE INVENTION

It is an object of the invention to provide an accurate phase detection circuit comprising few circuit elements and operating unambiguously.

According to the invention, a phase detection circuit of the type described in the opening paragraph is therefore characterized in that the logic circuit includes a group of gate circuits alternately having an AND and a NOR function or a NAND and an OR function arranged each time between similar outputs of two successive memory elements and in that the measuring circuit comprises two EXCLUSIVE-OR gate circuits each being coupled to a pair of outputs of the delay circuit and having their outputs coupled to a control circuit for controlling the delay time of the delay circuit in such a way that it corresponds to the period of the first clock signal.

Using a control circuit for the delay time of the delay circuit in such a way that it corresponds to the period of the first clock signal provides the possibility of omitting the further memory elements, while the number of indicated gate circuits and the number of memory elements are now only determined by the number of steps that must be detected instead of by the desired accuracy. The indicated gate circuits further ensure an unambiguous determination of the phase relation between the two clock signals without additional measures being required in transitions between two successive steps.

A favorable application of the phase detection circuit is, for example, its use in a sampling frequency converter circuit in which a digitally decoded color television signal occurs at a sampling frequency of four times the chrominance sub-carrier frequency which is converted to a sampling frequency being a number of times the line frequency of the color television signal. Each output of a gate circuit can then switch on a group of interpolation coefficients associated with the measured phase relation.

BRIEF DESCRIPTION OF THE DRAWINGS

The invention will now be described in greater detail by way of example with reference to the accompanying drawings, in which.

DESCRIPTION OF THE PREFERRED EMBODIMENT

Figure 1:
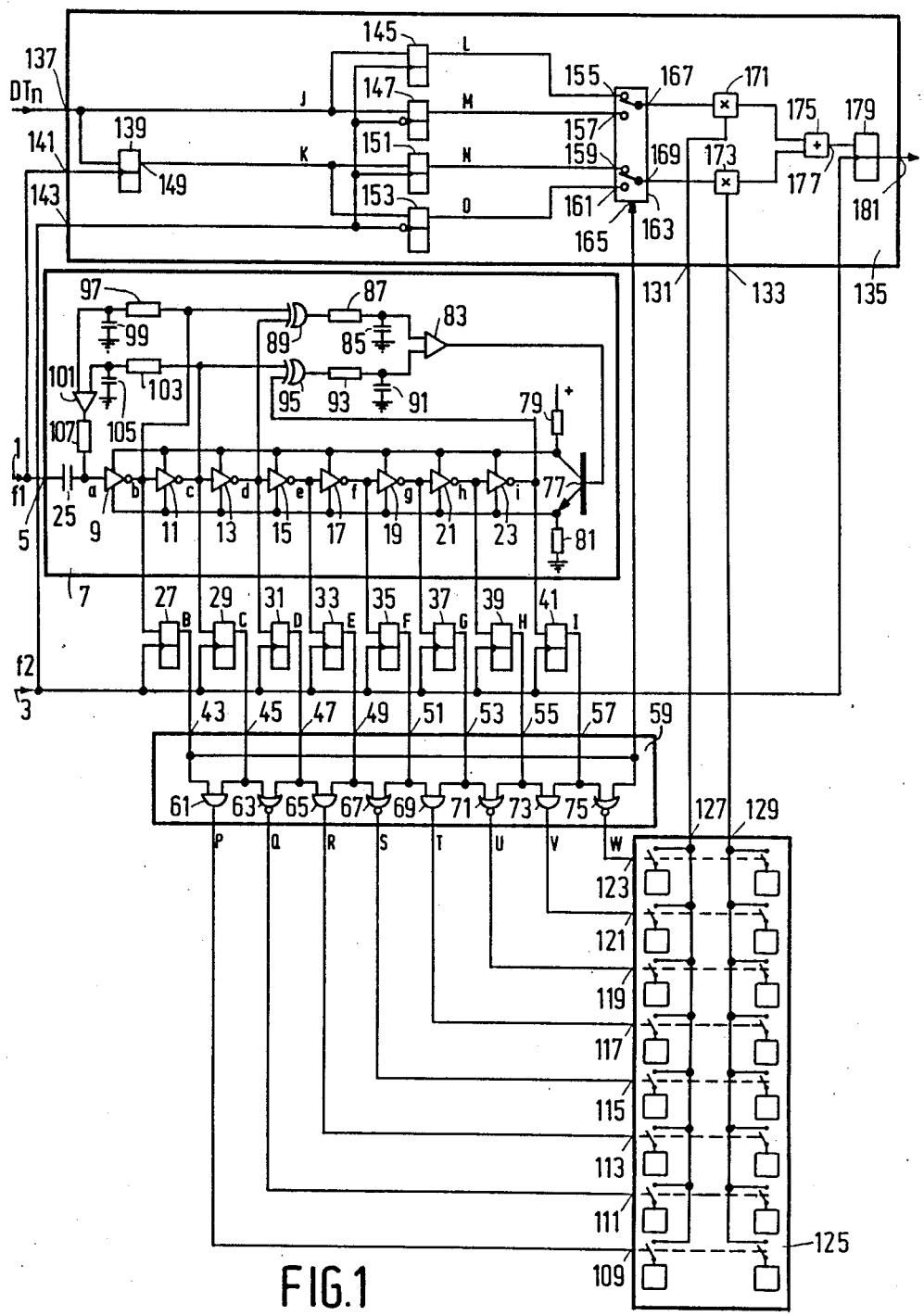
FIG. 1 is a block diagram of a phase detection circuit according to the invention, used in a sampling frequency converter circuit.

In FIG. 1 a first clock signal with a frequency $f_1$ is applied to an input 1 and a second clock signal with a frequency $f_2$ is applied to an input 3. The input 1 is connected to an input 5 of a delay circuit 7. The delay circuit 7 comprises a series arrangement of a plurality of inverters 9, 11, 13, 15, 17, 19, 21 and 23 used as delay elements whose input is connected to the input 5 of the delay circuit 7 via a capacitance 25. The outputs of each of the inverters 9, 11, 13, 15, 17, 19, 21 and 23 are connected to inputs of memory elements 27, 29, 31, 33, 35, 37, 39 and 41, respectively, whose clock signal inputs receive the second clock signal $f_2$ from the input 3.

Figure 2:
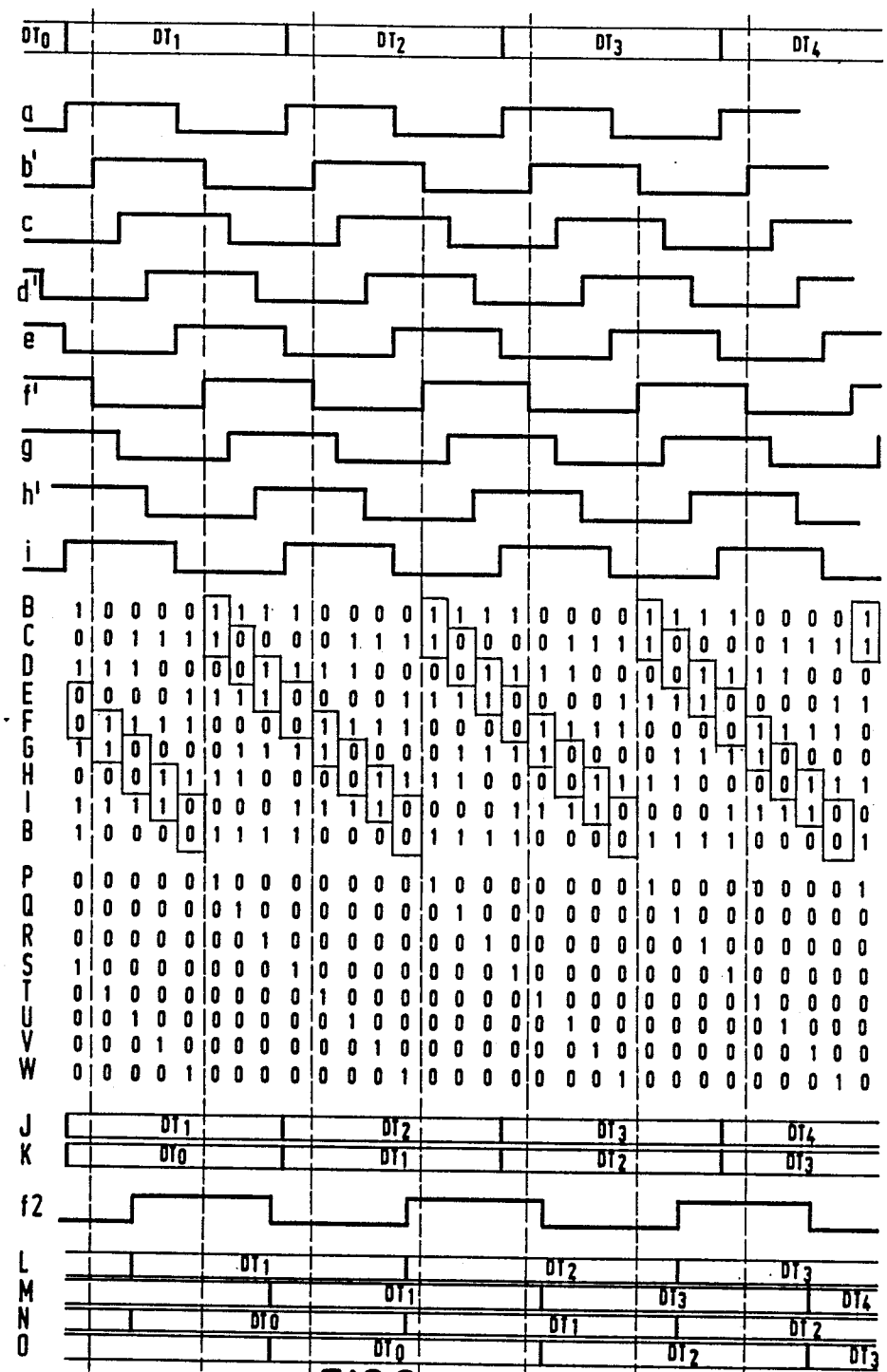
FIG. 2 shows the state at different points in the circuit of FIG. 1 as a function of time with reference to a plurality of waveforms and logic output values.

The waveform at the input of the inverter 9 is denoted by a in FIG. 2. For the sake of clarity FIG. 2 shows the inverse values b', d', f', h' of the waveforms b, d, f, h between the waveforms a and c, c and e, e and g, g and i of the waveforms b, c, d, e, f, g, h and i at the outputs of the inverters 9, 11, 13, 15, 17, 19, 21 and 23.

An output of each of the memory elements 27, 29, 31, 33, 35, 37, 39, 41 is connected to inputs 43, 45, 47, 49, 51, 53, 55, 57, respectively, of a logic circuit 59. An AND-gate 61, a NOR-gate 63, an AND-gate 65, a NOR-gate 67, an AND-gate 69, a NOR-gate 71, an AND-gate 73, a NOR-gate 75 are connected between the inputs 43 and 45, 45 and 47, 47 and 49, 49 and 51, 51 and 53, 53 and 55, and 57 and 43, respectively.

The positive and negative power supply terminals of the inverters 9, 11, 13, 15, 17, 19, 21 and 23 in the delay circuit 7 are connected to the collector and the emitter, respectively, of a transistor 77. The collector of the transistor 77 is connected to a positive power supply voltage via a resistor 79 and the emitter is connected to ground via a resistor 81, while the base is connected to an output of a differential amplifier 83, an input of which is connected to an output of an EXCLUSIVE-OR gate 89 via a smoothing network comprising a capacitance 85 and a resistor 87, and the other input of the amplifier 83 is connected to an output of an EXCLUSIVE-OR gate 95 via a smoothing network comprising a capacitance 91 and a resistor 93. The inputs of the EXCLUSIVE-OR gate 89 are connected to the outputs of the inverters 9 and 13, and those of the EXCLUSIVE-OR gate 95 are connected to the outputs of the inverters 11 and 23. In this way a control circuit is obtained with which the delay time of the delay circuit is controlled in such a way that it is equal to the period of the first clock signal, as will be explained hereinafter.

Furthermore, the output of the inverter 9 is connected to an input of a differential amplifier 101 via a smoothing network comprising a resistor 97 and a capacitance 99, the other input of this differential amplifier 101 being connected to the output of the inverter 11 via a smoothing network comprising a resistor 103 and a capacitance 105. The output of the differential amplifier 101 is connected to the input of the inverter 9 via a resistor 107. In this way a control circuit is formed which controls the duty cycle of the first clock signal conveyed by the delay circuit at fifty percent, independent of amplitude variations which could be caused by the previously mentioned control circuit for the power supply voltage. A possible elongation of the logic-one sections of the waveform b with respect to its logic-zero sections involves an elongation of the logic-zero sections of the waveform c with respect to its logic-one sections. Consequently the direct voltage across the capacitance 99 increases and that across the capacitance 105 decreases so that the direct voltage at the input of the inverter 9 increases. This results in the logic-one sections of the waveform b becoming shorter again and the logic-zero sections becoming longer, while the reverse effect occurs in the waveform c. Amplitude variations cause the levels at the two inputs of the differential amplifier to increase or decrease to an equal extent and have no influence on the accuracy of the control.

In the columns of FIG. 2 which are each limited by the leading edges of two successive waveforms a and b', b' and c, c and d' and so forth, it has been indicated which logic state is assumed by the outputs B, C, D, E, F, G, H, I and B of the memory elements 27, 29, 31, 33, 35, 37, 39, 41 and 27, respectively, if the active edge of the second clock signal $f_2$ falls in the relevant column. The outputs P, Q, R, S, T, U, V and W of the gate circuits 61, 63, 65, 67, 69, 71, 73 and 75, respectively, then assume the states shown in the relevant column of FIG. 2.

If the edge of $f_2$ falls in the column between the leading edges of a and b', E and F become zero and the output S of the NOR-gate 67 becomes one. The outputs P, Q, R, T, U, V, W of the other gates are then zero, as will be readily evident. If the edge of $f_2$ falls in the column between the leading edges of b' and c, F and G become one and the output T of the AND-gate 69 becomes one. As is shown in the Figure, the values of E and H then do not change. As a result only the output F of the memory element 33 determines there in which column the relevant edge of $f_2$ falls. Since it can only have one value, there is no ambiguity at the transition of the $f_2$ edge from the one column to the other. Thus, only one of the outputs of the gate circuits of the logic circuit is always logic one.

The control circuit for the delay time operates as follows. If the delay time of each of the inverters 9, 11, 13, 15, 17, 19, 21 and 23 increases, the delay time of the delay circuit 7 will be larger than the period of the first clock signal and the waveforms b', c, d', e, f', g, h' and i of FIG. 2 are shifted to the right with respect to the waveform a. The waveform b' shifts by a time interval Δ, the waveform c shifts by 2Δ, the waveform d' shifts by 3Δ and so forth. The EXCLUSIVE-OR gates 89 and 95 supply a logic-one signal between the rising edges of the waveforms b' and d' and between the falling edges of the waveforms i and c, and a logic-zero signal otherwise. If the delay time of the delay circuit is equal to the period of the first clock signal $f_1$, the duty cycle of these output signals is fifty percent. If the delay time of the inverters should increase by Δ, the logic-one sections of the output signal of the EXCLUSIVE-OR gate will be longer by 2Δ and the logic-zero sections will be shorter by 2Δ, while the duty cycle then increases. For the output signal of the EXCLUSIVE-OR gate 95 the logic-one sections will then be shorter by 5Δ and the logic-zero sections will be longer by 5Δ so that the duty cycle decreases. The voltage across the capacitance 85 will then be higher and that across the capacitance 91 will be lower and the output voltage of the differential amplifier 83 decreases so that the supply voltage of the inverters increases via the transistor 77 and the delay time of the inverters decreases resulting in the duty cycle of the output signals of the EXCLUSIVE-OR gates 89 and 95 becoming fifty percent again and the delay time of the delay circuit 7 becoming equal again to the period of the first clock signal.

An output of each of the gate circuits 61, 63, 65, 67, 69, 71, 73, 75 is connected to an input 109, 111, 113, 115, 117, 119, 121, 123, respectively, of a coefficient selection circuit 125 so that an output pair 127, 129 thereof applies a coefficient pair to an input pair 131, 133 of a sampling frequency converter circuit 135, which pair is associated with the phase relation between the two clock signals $f_1$ and $f_2$ measured by the phase detection circuit 7, 27, 29, 31, 33, 35, 37, 39, 41, 59.

Furthermore, the sampling frequency converter circuit 135 has an input 137 to which a data signal $DT_n$ is applied which is, for example, a digital video signal whose sampling frequency is four times the chrominance sub-carrier frequency of a television signal and which occurs synchronized with the first clock signal $f_1$. This data signal is denoted by $DT_1$, $DT_2$, ... at J in FIG. 2 and is dependent on the clock signal period in which it occurs. This data signal is applied to a memory element 139, the clock signal input of which is connected to an input 141 of the sampling frequency converter circuit 135 at which the first clock signal of the frequency $f_1$ applied to the input 1 occurs. An input 143 of the sampling frequency converter circuit 135 receives the second clock signal of the frequency $f_2$ from the input 3 of the circuit, which frequency may be, for example between 0.6 $f_1$ and 1.2 $f_1$.

The input 137 of the sampling frequency converter 135 is connected to the inputs of two memory elements 145, 147 and applies thereto the data signal $DT_1$, $DT_2$, ... indicated by J in FIG. 2. An output 149 of the memory element 139 applies a data signal $DT_0$, $DT_1$, ... denoted by K in FIG. 2 and delayed over a clock signal period of $f_1$ to the inputs of two memory elements 151, 153. The clock signal inputs of the memory elements 145 and 151 receive the clock signal $f_2$ from the input 143 of the sampling frequency converter circuit 135, and the clock signal inputs of the memory elements 147, 153 receive the inverted clock signal $f_2$ from this input 143.

The outputs of the memory elements 145, 147, 151 and 153 apply data signals synchronized with $f_2$ and indicated by L, M, N and O, respectively, in FIG. 2 to inputs 155, 157, 159 and 161, respectively, of a change-over switch 163, the data signals M and O being shifted over half a clock period of $f_2$ with respect to the data signals L and N. An operating signal input 165 of the change-over switch 163 is connected to the output of the memory element 27 and receives the signal denoted by B in FIG. 2. In the region where the rising edge of $f_2$ cannot coincide with the rising edge of $f_1$, this B signal is zero and the change-over switch 163 assumes the state shown so that the signals L and N appear at outputs 167 and 169, respectively, of this switch. In the region where the rising edge $f_2$ can coincide with that of $f_1$, errors may occur in these signals L and N. In this region the signal B is one and the change-over switch 163 assumes the position not shown so that the signals M and O appear at the outputs 167 and 169, respectively. These signals M and O are sampled at instants which are shifted over half a period of $f_2$ with respect to the sampling instants of L and N. At the moments when the rising edges of $f_1$ and $f_2$ can coincide, the rising edges of $f_1$ and the inverted $f_2$ signal cannot, so that the signals M and O cannot exhibit any irregularities.

The signals at the outputs 167 and 169 of the change-over switch 163 are supplied via multipliers 171 and 173 to an adder circuit 175, an output 177 of which is connected to the input of a memory element 179 whose clock signal input receives the second clock signal $f_2$ from the input 3 of the circuit. In the multipliers 171 and 173, the signal at the outputs 167 and 169 of the change-over switch 163 is multiplied by the coefficient applied to the inputs 131 and 133, respectively, of the sampling frequency converter circuit 135 so that an interpolation associated with the measured phase relation occurs in the adder circuit 175. This interpolation is linear in this case, but if desired it can be extended to an interpolation comprising more signal samples.

It will be evident that the phase detection circuit can also be used for other purposes such as, for example, for selecting a data signal phase corresponding to the second clock signal.

If desired, the delay circuit 7 can be formed with a parallel section to which, for example, the top three inputs of the EXCLUSIVE-OR gates can be connected.

It is of course also possible to choose the number of steps in which the phase relation between the two clock signals can be determined to be different from those in the embodiment shown, if the number of delay elements of the delay circuit, the number of memory elements and the number of gate circuits is adapted thereto and if the EXCLUSIVE-OR gates are connected to adapted branches.

The gate circuits 61, 63, 65, 67, 69, 71, 73, 75 may be of the inverse type if inverted outputs signals are desired or if they are connected to the inverse outputs of the memory elements.

I claim:

1. A phase detection circuit for stepwise measurement of a phase relation between two clock signals, comprising a delay circuit controllable by a first one ($f_1$) of the two clock signals, said delay circuit having a plurality of tappings each being coupled to an input of a different one of a plurality of memory elements, a clock signal input of each of the memory elements is controllable by the second one ($f_2$) of the two clock signals and an output of each of the memory elements is coupled to a logic circuit for determining the phase relation to be measured, an output combination of said logic circuit indicating the phase relation between said two clock signals, while a measuring circuit for determining the period of the first clock signal is coupled to a plurality of outputs of the delay circuit, characterized in that the logic circuit includes a group of gate circuits alternately having an AND function and a NOR function arranged each time between similar outputs of two successive memory elements and in that the measuring circuit comprises two EXCLUSIVE-OR gate circuits each being coupled to a pair of outputs of the delay circuit and having their outputs coupled to a control circuit for controlling the delay time of the delay circuit in such a way that it corresponds to the period of the first clock signal.

2. A phase detection circuit as claimed in claim 1, characterized in that the input of the delay circuit is coupled to an output of a differential amplifier, a first and a second input of said differential amplifier being coupled to an output of a first and a second delay element, respectively, of the delay circuit via a first and a second smoothing network for controlling the duty cycle of the first clock signal conveyed by the delay circuit at substantially fifty percent.

3. A phase detection circuit as claimed in claim 1 or 2, characterized in that an input of a coefficient selection circuit is coupled to each of the outputs of the gate circuits for selecting a coefficient series corresponding to a detected phase of the second clock signal with respect to the first clock signal for an interpolation circuit of a sampling frequency converter circuit (135).

4. A phase detection circuit as claimed in claim 3, characterized in that the output of the memory element connected to the output of a first delay element of the delay circuit is coupled to an operating signal input of a change-over switch for selecting a group of data signals resampled by means of the second clock signal or the inverse thereof for the purpose of applying said data signals to the interpolation circuit.

* * * * *